(12) United States Patent
Lin et al.

(10) Patent No.: US 10,103,104 B2
(45) Date of Patent: Oct. 16, 2018

(54) PACKAGE CARRIER AND MANUFACTURING METHOD OF PACKAGE CARRIER

(71) Applicant: Unimicron Technology Corp., Taoyuan (TW)

(72) Inventors: Yung-Ching Lin, Taipei (TW); Chen-Chun Liu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/259,011

(22) Filed: Sep. 7, 2016

(65) Prior Publication Data
US 2018/0005949 A1 Jan. 4, 2018

(30) Foreign Application Priority Data
Jun. 30, 2016 (TW) .............................. 105120846 A

(51) Int. Cl.
*H05K 1/02* (2006.01)
*H05K 1/11* (2006.01)
(Continued)

(52) U.S. Cl.
CPC ...... *H01L 23/5386* (2013.01); *H01L 21/4857* (2013.01); *H01L 23/5383* (2013.01); *H01L 23/5387* (2013.01); *H01L 23/5389* (2013.01); *H05K 1/028* (2013.01); *H05K 1/111* (2013.01); *H05K 1/183* (2013.01); *H05K 3/0026* (2013.01);
(Continued)

(58) Field of Classification Search
CPC ............. H01L 23/5386; H01L 23/5389; H01L 23/5383; H01L 23/5387; H01L 21/4857; H05K 3/0026; H05K 3/4697
See application file for complete search history.

(56) References Cited

U.S. PATENT DOCUMENTS 6,444,921 B1 * 9/2002 Wang ................ H01L 23/49827
174/254
7,531,752 B2 * 5/2009 Hirakata ................ H05K 1/028
174/254

(Continued)

FOREIGN PATENT DOCUMENTS

TW I388043 3/2013
TW I465162 12/2014

OTHER PUBLICATIONS

"Office Action of Taiwan Counterpart Application", dated Feb. 22, 2017, p. 1-p. 4.

*Primary Examiner* — Ishwarbhai B Patel
(74) *Attorney, Agent, or Firm* — JCIPRNET

(57) ABSTRACT

A package carrier including a flexible substrate, a first build-up structure and a second build-up structure is provided. The flexible substrate has a first surface and a second surface opposite to each other, and has a first opening connected between the first surface and the second surface. The first build-up structure is disposed on the first surface and covers the first opening. The second build-up structure is disposed on the second surface and has a second opening, and the first opening and the second opening are connected to each other to form a chip accommodating cavity together. In addition, a manufacturing method of the package carrier and a chip package structure having the package carrier are also provided.

10 Claims, 4 Drawing Sheets

(51) Int. Cl.
  *H05K 1/18* (2006.01)
  *H05K 3/36* (2006.01)
  *H05K 3/46* (2006.01)
  *H01L 23/538* (2006.01)
  *H01L 21/48* (2006.01)
  *H05K 3/00* (2006.01)
  H05K 3/30 (2006.01)
  H05K 3/32 (2006.01)
  H05K 1/03 (2006.01)

(52) U.S. Cl.
  CPC ................ *H05K 3/36* (2013.01); *H05K 3/46* (2013.01); *H05K 3/4697* (2013.01); *H01L 2224/16225* (2013.01); *H01L 2224/48091* (2013.01); *H01L 2224/48227* (2013.01); *H01L 2224/73253* (2013.01); *H05K 1/0277* (2013.01); *H05K 1/0298* (2013.01); *H05K 1/0393* (2013.01); *H05K 1/185* (2013.01); *H05K 3/0032* (2013.01); *H05K 3/30* (2013.01); *H05K 3/32* (2013.01); *H05K 3/4691* (2013.01); *H05K 2201/0154* (2013.01)

(56) References Cited

U.S. PATENT DOCUMENTS

| | | |
|---|---|---|
| 2006/0049495 A1 | 3/2006 | Hazeyama et al. |
| 2009/0038836 A1* | 2/2009 | Takahashi ............... H05K 1/148 174/261 |
| 2015/0156880 A1* | 6/2015 | Daizo .................... H05K 1/183 174/251 |

* cited by examiner

PACKAGE CARRIER AND MANUFACTURING METHOD OF PACKAGE CARRIER

CROSS-REFERENCE TO RELATED APPLICATION

This application claims the priority benefit of Taiwan application serial no. 105120846, filed on Jun. 30, 2016. The entirety of the above-mentioned patent application is hereby incorporated by reference herein and made a part of this specification.

BACKGROUND OF THE INVENTION

1. Field of the Invention

The present invention relates to a package carrier, a manufacturing method of the package carrier and a chip package structure, in particular, relates to a package carrier having a chip accommodating cavity, a manufacturing method of the package carrier, and a chip package structure having the package carrier.

2. Description of Related Art

In recent years, with the high functionality demand of the electronic products, high-speed demand of the signal transmission and high-density demand of the circuit elements, semiconductor-related industries are increasingly developing. The semiconductor integrated circuit (IC) industry includes integrated circuit manufacturing and integrated circuit packaging. Semiconductor manufacturing is about fabricating an integrated circuit on the wafer. Integrated circuit packaging can provide structure protection, electrical transmission and good heat dissipation to the wafer where the integrated circuits were produced (ie, a portion of the wafer after the cutting).

The current system in package (SiP) and package on package (PoP) are limited to the restrictions such as package area and pad pitch of the stacked package. So, the chip disposition space of the package can't be effectively promoted.

SUMMARY OF THE INVENTION

The present invention provides a package carrier, able to increase the disposition space of the chip.

The present invention provides a manufacturing method of a package carrier, and the package carrier manufactured by the manufacturing method can increase the disposition space of the chip.

The present invention provides a chip package structure, and the package carrier of the chip package structure can increase the disposition space of the chip.

The package carrier of the invention includes a flexible substrate, a first build-up structure and a second build-up structure. The flexible substrate has a first surface and a second surface opposite to each other, and has a first opening connected between the first surface and the second surface. The first build-up structure is disposed on the first surface and covers the first opening. The second build-up structure is disposed on the second surface and has a second opening, and the first opening and the second opening are connected to each other to form a chip accommodating cavity together.

In an embodiment of the invention, the package carrier further includes a patterned barrier layer, wherein the patterned barrier layer is disposed on the first surface and extended to a bottom surface of the chip accommodating cavity.

In an embodiment of the invention, the patterned barrier layer is extended along an inner edge of the first opening.

In an embodiment of the invention, a contour of the second opening matches a contour of the first opening.

In an embodiment of the invention, the package carrier further includes a patterned conductive layer, wherein the patterned conductive layer is disposed on the first surface and extended to a bottom surface of the chip accommodating cavity.

In an embodiment of the invention, the package carrier and another package carrier share the flexible substrate, and a section of the flexible substrate between the two package carriers is adapted to be bent.

The manufacturing method of a package carrier of the invention includes the following steps. A flexible substrate is provided, wherein the flexible substrate has a first surface and a second surface opposite to each other. A first build-up structure is formed on the first surface. A second build-up structure is formed on the second surface. The flexible substrate and the second build-up structure are cut, so as to make a first to-be-removed region of the flexible substrate separated from other regions of the flexible substrate, and make a second to-be-removed region of the second build-up structure separated from other regions of the second build-up structure, wherein the first to-be-removed region is connected to the second to-be-removed region. The first to-be-removed region is separated from the first build-up structure, so as to remove the first to-be-removed region and the second to-be-removed region simultaneously to form a chip accommodating cavity.

In an embodiment of the invention, the manufacturing method of a package carrier further includes: forming a patterned barrier layer on the first surface before the formation of the first build-up structure on the first surface, wherein the patterned barrier layer is extended to the first to-be-removed region.

In an embodiment of the invention, the step of forming a patterned barrier layer on the first surface includes: making the patterned barrier layer extended along an edge of the first to-be-removed region.

In an embodiment of the invention, the step of cutting the flexible substrate and the second build-up structure includes: simultaneously cutting the flexible substrate and the second build-up structure by a laser process.

In an embodiment of the invention, the manufacturing method of a package carrier further includes: forming a patterned conductive layer on the first surface before the formation of the first build-up structure on the first surface, wherein the patterned conductive layer is extended to the first to-be-removed region.

In an embodiment of the invention, the manufacturing method of a package carrier further includes: making the package carrier and another package carrier share the flexible substrate, wherein a section of the flexible substrate between the two package carriers is adapted to be bent.

Based on the above, the package carrier of the invention makes the chip able to be laid in the chip accommodating cavity by the first opening of the flexible substrate and the second opening of the second build-up structure forming the chip accommodating cavity together, so as to increase the disposition space of the chip. In addition, because the flexible substrate is used as the core layer in the package carrier, some regions of the flexible substrate can be used as the release layer to remove part of the flexible substrate and part of the second build-up structure in the manufacturing process of the package carrier, so as to form the chip accommodating cavity, and make the manufacturing process of the package carrier more simplified.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
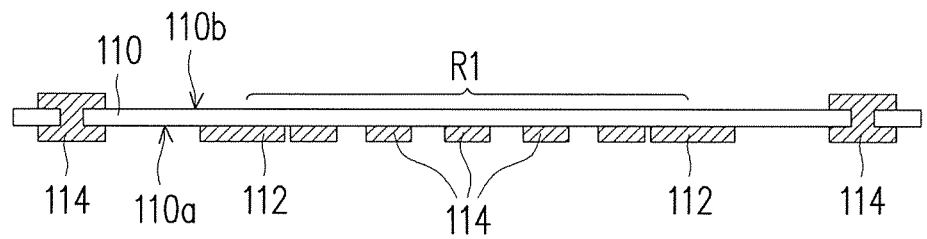
FIG. 1A to FIG. 1D are flow chart of the manufacturing method of a package carrier of an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1D are flow chart of the manufacturing method of a package carrier of an embodiment of the invention. First, please referring to FIG. 1A, a flexible substrate 110 is provided, wherein the flexible substrate 110 is polyimid (PI) flexible board, for example, and the flexible substrate has a first surface 110a and a second surface 110b opposite to each other. In addition, a patterned barrier layer 112 and a patterned conductive layer 114 are further formed on the first surface 110a of the flexible substrate 110, wherein the patterned barrier layer 112 and the patterned conductive layer 114 are extended to a first to-be-removed region R1 of the flexible substrate 110, and the patterned barrier layer 112 is extended along an edge of the first to-be-removed region R1. The patterned barrier layer 112 and the patterned conductive layer 114 are simultaneously formed by patterning a metal layer (Cu layer, for example) on the flexible substrate 110.

Figure 1B:
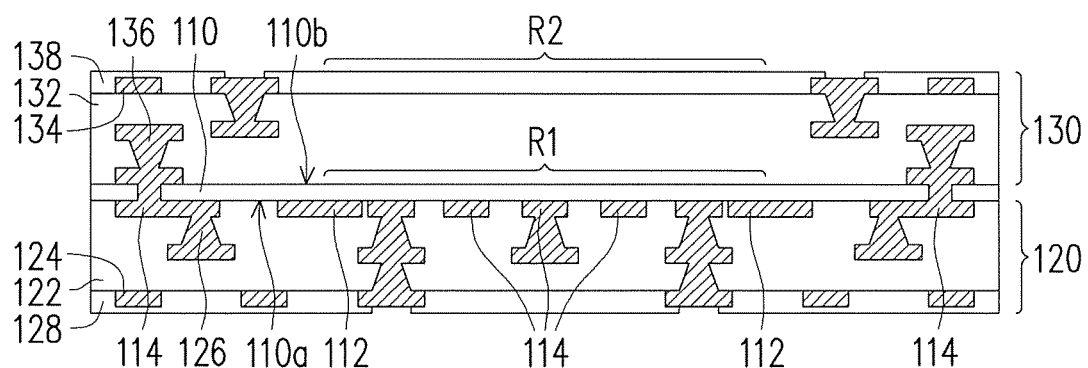

Then, please referring to FIG. 1B, a first build-up structure 120 is formed on the first surface 110a of the flexible substrate 110, and a second build-up structure 130 is formed on the second surface 110b of the flexible substrate 110. The first build-up structure 120 includes a dielectric layer 122, a circuit layer 124 disposed on the dielectric layer 122, a conductive via 126, a solder mask layer 128 disposed on the surface of the dielectric layer 122 and covering the circuit layer 124, for example. The second build-up structure 130 includes a dielectric layer 132, a circuit layer 134 disposed on the dielectric layer 132, a conductive via 136, a solder mask layer 138 disposed on the surface of the dielectric layer 132 and covering the circuit layer 134, for example.

Figure 1C:
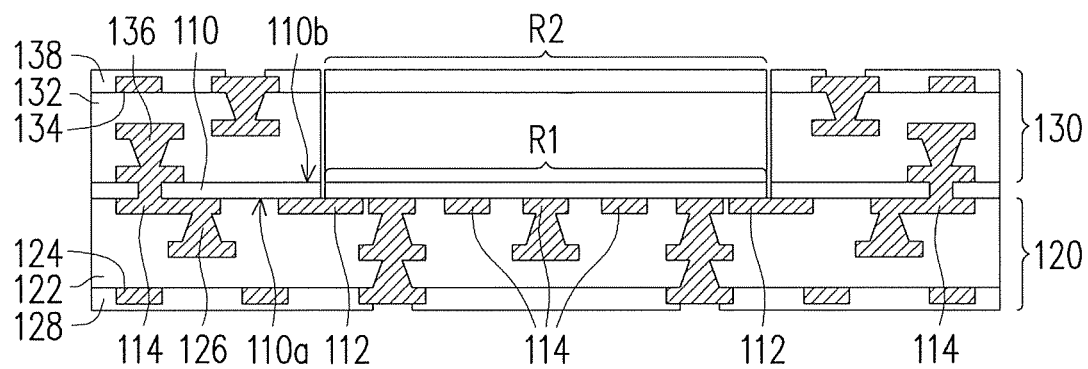

Please referring to FIG. 1C, the flexible substrate 110 and the second build-up structure 130 are cut, so as to make a first to-be-removed region R1 of the flexible substrate 110 separated from other regions of the flexible substrate 110, and make a second to-be-removed region R2 of the second build-up structure 130 separated from other regions of the second build-up structure 130, wherein the first to-be-removed region R1 is connected to the second to-be-removed region R2. In the embodiment, the flexible substrate 110 and the second build-up structure 130 are cut simultaneously by laser process, for example, wherein the patterned barrier layer 112 extended to the first to-be-removed region R1 can prevent the first build-up structure 120 from unintended cutting by the laser.

Figure 1D:
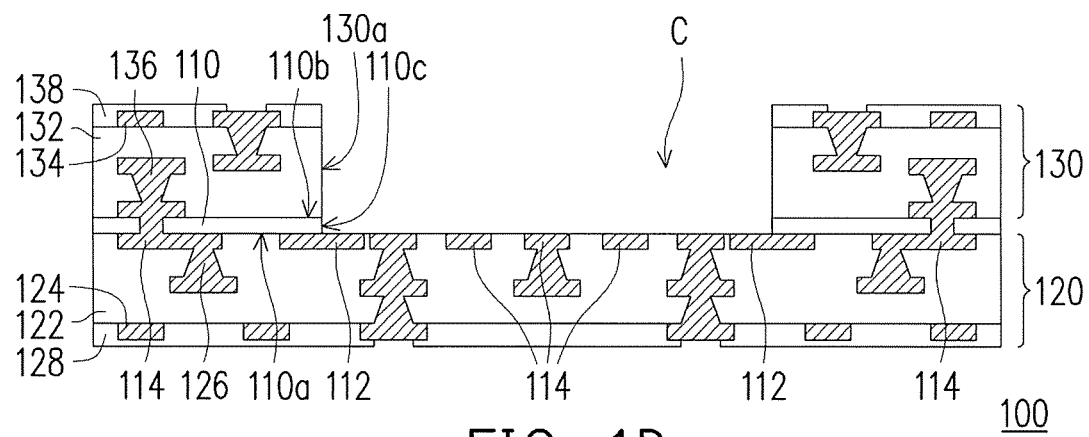

Then, the first to-be-removed region R1 of the flexible substrate 110 is separated from the first build-up structure 120, so as to remove the first to-be-removed region R1 and the second to-be-removed region R2 simultaneously to form a chip accommodating cavity C as illustrated in FIG. 1D, and the manufacturing of the package carrier 100 is completed. Specifically, in the above process, the first to-be-removed region R1 is able to be used as a release layer and can be successfully separated from the first build-up structure 120 through the easily separated characteristics of the flexible substrate 110.

Figure 2:
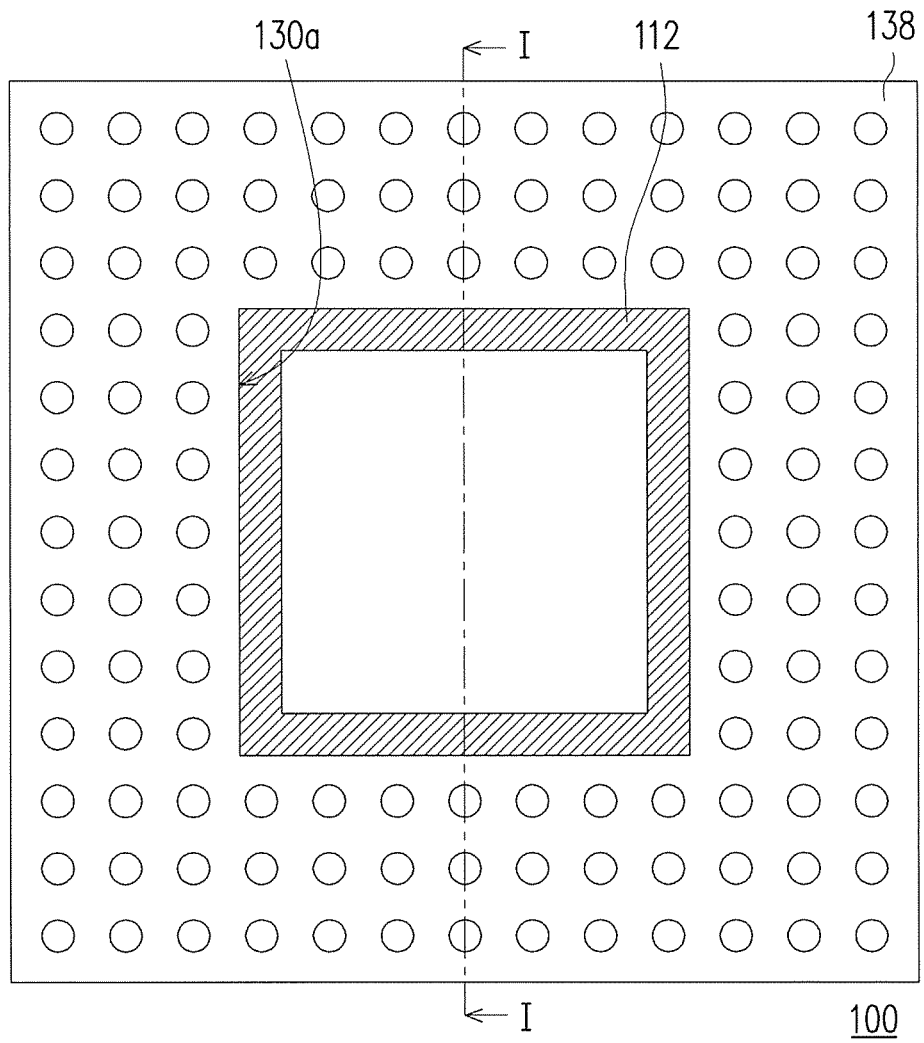
FIG. 2 is a schematic top view of the package carrier of FIG. 1D.

FIG. 2 is a schematic top view of the package carrier of FIG. 1D, and the cross-section illustrated in FIG. 1D corresponds to the line I-I in FIG. 2. To make the figure clearer, the patterned conductive layer 114 in FIG. 1D is not shown in FIG. 2. Please referring to FIG. 1D and FIG. 2, the package carrier 100 manufactured by the above manufacturing process includes a flexible substrate 110, a first build-up structure 120 and a second build-up structure 130. The flexible substrate 110 has a first surface 110a and a second surface 110b opposite to each other, and has a first opening 110c connected between the first surface 110a and the second surface 110b, and the first opening 110c is formed by removing the first to-be-remove region R1. The first build-up structure 120 is disposed on the first surface 110a of the flexible substrate 110 and covers the first opening 110c. The second build-up structure 130 is disposed on the second surface 110b of the flexible substrate 110 and has a second opening 130a, the second opening 130a is formed by removing the second to-be-removed region R2 in the above process, and the contour of the second opening 130a matches the contour of the first opening 110c, for example. The first opening 110c of the flexible substrate 110 and the second opening 130a of the second build-up structure 130 are connected to each other and form the chip accommodating cavity C together. The package carrier 100 further includes a patterned barrier layer 112 and a patterned conductive layer 114, the patterned barrier layer 112 and the patterned conductive layer 114 are disposed on the first surface 110a of the flexible substrate 110 and extended to the bottom surface of the chip accommodating cavity C, and the patterned barrier layer 112 is extended along the inner edge of the first opening 110c.

The package carrier 100 of the embodiment make the chip able to be laid in the chip accommodating cavity C by the first opening 110c of the flexible substrate 110 and the second opening 130a of the second build-up structure 130 forming the chip accommodating cavity C together, as illustrated above, so as to increase the disposition space of the chip. In addition, because the flexible substrate 110 is used as the core layer in the package carrier 100, part of the region (which is the first to-be-removed region R1) of the flexible substrate 110 can be used as the release layer to remove part of the flexible substrate 110 and part of the second build-up structure 130 in the manufacturing process of the package carrier 100, so as to form the chip accommodating cavity C, and make the manufacturing process of the package carrier 100 more simplified. The following paragraphs substantially describe the chip package structure formed by the package carrier and the chip.

Figure 3:
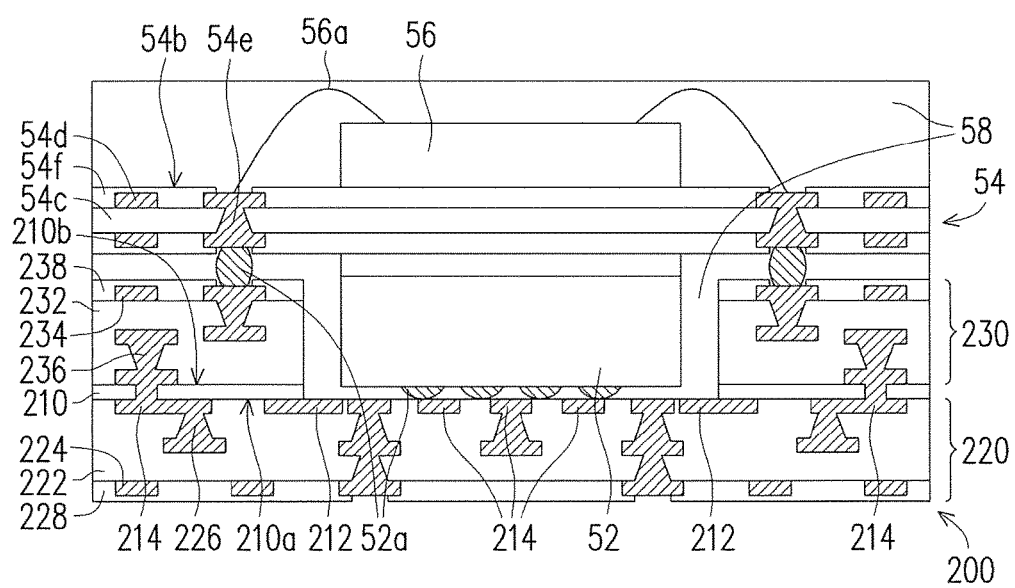
FIG. 3 is a schematic view of a chip package structure according to an embodiment of the invention.

FIG. 3 is a schematic view of a chip package structure according to an embodiment of the invention. In the chip package structure 50 of FIG. 3, the disposition and operation method of the first package carrier 200, the flexible substrate 210, the first surface 210a, the second surface 210b, the first opening 210c, the patterned barrier layer 212, the patterned conductive layer 214, the first build-up structure 220, the dielectric layer 222, the circuit layer 224, the conductive via 226, solder mask layer 228, the second build-up structure 230, the dielectric layer 232, the circuit layer 234, the conductive via 236, the solder mask layer 238, the second opening 230a, the chip accommodating cavity C' are the same with the disposition and operation method of the first package carrier 100, the flexible substrate 110, the first surface 110a, the second surface 110b, the first opening 110c, the patterned barrier layer 112, the patterned conductive layer 114, the first build-up structure 120, the dielectric layer 122, the circuit layer 124, the conductive via 126, the solder mask layer 128, the second build-up structure 130, the dielectric layer 132, the circuit layer 134, the conductive via 136, the solder mask layer 138, the second opening 130a, the chip accommodating cavity C' of FIG. 1D, and are not repeated herein.

The chip package structure 50 further includes a first chip 52, a second package carrier 54, a second chip 56 and an encapsulation gel 58. The first chip 52 is disposed in the chip accommodating cavity C', the second package carrier 54 has a third surface 54a and a fourth surface 54b opposite to each other, the second package carrier 54 is stacked on the second build-up structure 230 and the first chip 52 through the third surface 54a, and the second chip 56 is disposed on the fourth surface 54b. The second package carrier 54 includes a dielectric layer 54c, a circuit layer 54d disposed on the dielectric layer 54c, a conductive via 54e connected to the circuit layer 54d, a solder mask layer 54f disposed on the surface of the dielectric layer 54c and covering the circuit layer 54d, for example. The first chip 52 and the second package carrier 54 are connected to the first package carrier 200 through the solder ball 52a, for example, and the second chip 56 can be connected to the circuit layer 54d through the solder wire 56a. Encapsulation gel 58 is used to cover the first chip 52, the second chip 56, at least part of the first package carrier 200 and at least part of the second package carrier 54. The first chip 52 and the second chip 54 can be application processor (AP) chip, memory chips or other suitable types of active, passive components, the present invention does not limit their species.

Figure 4:
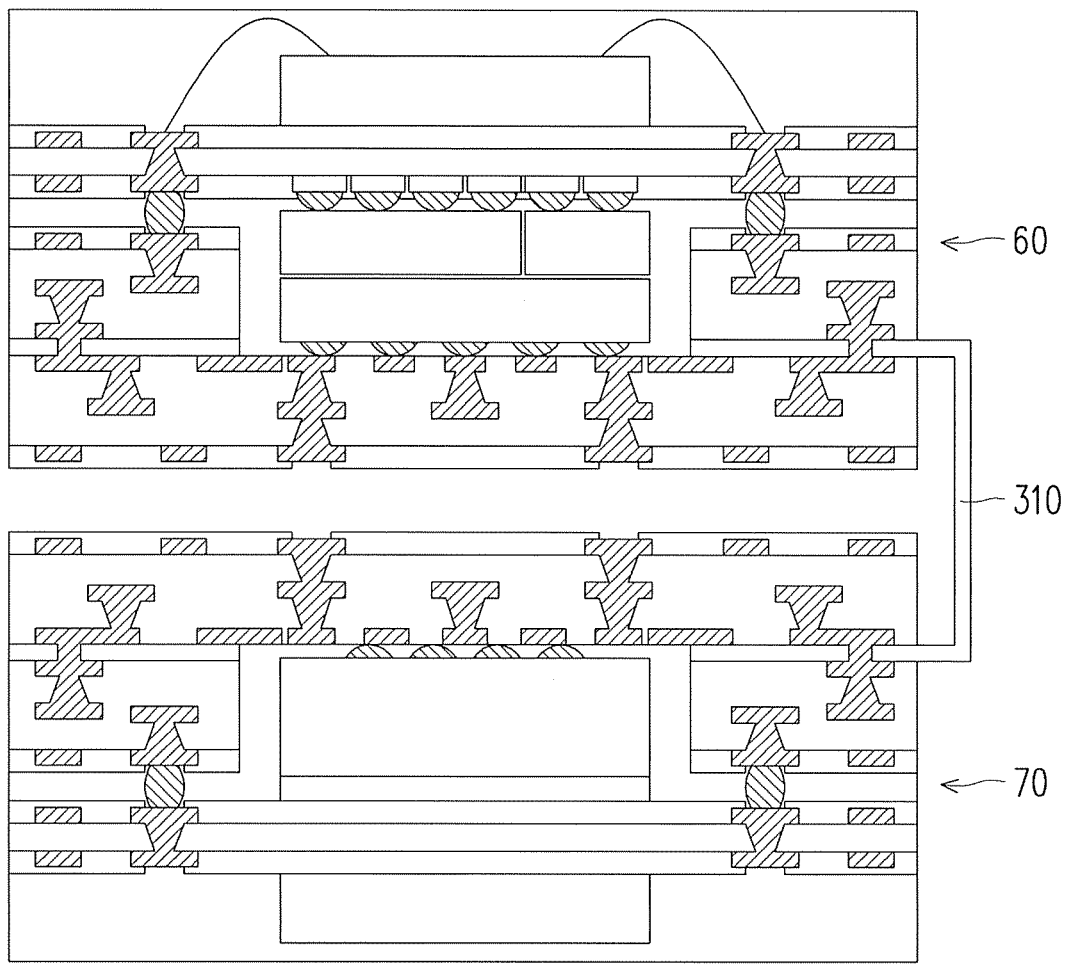
FIG. 4 is a schematic view of a chip package structure according to another embodiment of the invention.

FIG. 4 is a schematic view of a chip package structure according to another embodiment of the invention. The chip package structure 60, the chip package structure 70 of FIG. 4 and their specific structures are similar to the chip package structure 50 of FIG. 3, and are not repeated herein. The difference between the embodiment of FIG. 4 and the foregoing embodiments lies in that the chip package structure 60 and its package carrier and the chip package structure 70 and its package carrier share the flexible substrate 310, so that the chip package structure 60 and the chip package structure 70 are electrically connected to each other through the flexible substrate 310. In addition, the section of the flexible substrate 310 between the chip package structures 60, 70 is adapted to be bent, so that the chip package structures 60, 70 can be disposed to have different relative positions according to different disposition environment. In other embodiments, the flexible substrate can be shared by more chip package structures, the present invention is not limited thereof.

Based on the above, the package carrier of the invention makes the chip able to be laid in the chip accommodating cavity by the first opening of the flexible substrate and the second opening of the second build-up structure forming the chip accommodating cavity together, so as to increase the disposition space of the chip. In addition, because the flexible substrate is used as the core layer in the package carrier, some regions of the flexible substrate can be used as the release layer to remove part of the flexible substrate and part of the second build-up structure in the manufacturing process of the package carrier, so as to form the chip accommodating cavity, and make the manufacturing process of the package carrier more simplified. Further more, several chip package structures can share single flexible substrate, and the section of the flexible substrate between two chip package structure is adapted to be bent, so that the plurality of chip package structures can be disposed to have different relative positions according to different disposition environment and the degrees of freedom of disposition of the chip package structure can be increased.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A package carrier, comprising:
  a flexible substrate, having a first surface and a second surface opposite to each other, and having a first opening connected between the first surface and the second surface;
  a first build-up structure, disposed on the first surface and covering the first opening;
  a second build-up structure, disposed on the second surface and having a second opening, wherein the first opening and the second opening are connected to each other to form a chip accommodating cavity together; and
  a patterned barrier layer, disposed on the first surface and extended to a bottom surface of the chip accommodating cavity, wherein the patterned barrier layer is embedded in the first build-up structure.

2. The package carrier according to claim 1, wherein the patterned barrier layer is extended along an inner edge of the first opening.

3. The package carrier according to claim 1, wherein a contour of the second opening matches a contour of the first opening.

4. The package carrier according to claim 1, further comprising a patterned conductive layer, wherein the patterned conductive layer is disposed on the first surface and extended to the bottom surface of the chip accommodating cavity.

5. The package carrier according to claim 1, wherein the package carrier and another package carrier share the flexible substrate, and a section of the flexible substrate between the two package carriers is adapted to be bent.

6. A manufacturing method of a package carrier, comprising:
  providing a flexible substrate, wherein the flexible substrate has a first surface and a second surface opposite to each other;

forming a first build-up structure on the first surface;
forming a second build-up structure on the second surface;
cutting the flexible substrate and the second build-up structure, so as to make a first to-be-removed region of the flexible substrate separated from other regions of the flexible substrate, and make a second to-be-removed region of the second build-up structure separated from other regions of the second build-up structure, wherein the first to-be-removed region is connected to the second to-be-removed region;
separating the first to-be-removed region from the first build-up structure, so as to remove the first to-be-removed region and the second to-be-removed region simultaneously to form a chip accommodating cavity; and
forming a patterned barrier layer on the first surface before the formation of the first build-up structure on the first surface, wherein the patterned barrier layer is extended to the first to-be-removed region, wherein the patterned barrier layer is embedded in the first build-up structure.

7. The manufacturing method of a package carrier according to claim 6, wherein a step of forming a patterned barrier layer on the first surface comprises:
making the patterned barrier layer extended along an edge of the first to-be-removed region.

8. The manufacturing method of a package carrier according to claim 6, wherein a step of cutting the flexible substrate and the second build-up structure comprises:
simultaneously cutting the flexible substrate and the second build-up structure by a laser process.

9. The manufacturing method of a package carrier according to claim 6, further comprising:
forming a patterned conductive layer on the first surface before the formation of the first build-up structure on the first surface, wherein the patterned conductive layer is extended to the first to-be-removed region.

10. The manufacturing method of a package carrier according to claim 6, further comprising:
making the package carrier and another package carrier share the flexible substrate, wherein a section of the flexible substrate between the two package carriers is adapted to be bent.

\* \* \* \* \*